(12) United States Patent
Walker et al.

(10) Patent No.: US 11,406,885 B2
(45) Date of Patent: Aug. 9, 2022

(54) PORTABLE ELECTRONIC DEVICES

(71) Applicant: Underwater Audio LLC, Corvallis, OR (US)

(72) Inventors: Todd E. Walker, Corvallis, OR (US); Scott E. C. Walker, Corvallis, OR (US); Francis Alexander Zinsli, Corvallis, OR (US)

(73) Assignee: UNDERWATER AUDIO LLC, Corvallis, OR (US)

( * ) Notice: Subject to any disclaimer, the term of this patent is extended or adjusted under 35 U.S.C. 154(b) by 0 days.

(21) Appl. No.: 15/891,929

(22) Filed: Feb. 8, 2018

(65) Prior Publication Data

US 2019/0046858 A1 Feb. 14, 2019

Related U.S. Application Data

(60) Provisional application No. 62/456,181, filed on Feb. 8, 2017.

(51) Int. Cl.
| | |
|---|---|
| *A63B 69/12* | (2006.01) |
| *A63B 24/00* | (2006.01) |
| *A45C 11/22* | (2006.01) |
| *H04M 1/02* | (2006.01) |
| *A45C 11/00* | (2006.01) |
| *A63B 71/06* | (2006.01) |
| *G07C 1/24* | (2006.01) |
| *H01M 50/24* | (2021.01) |
| *H01M 50/209* | (2021.01) |
| *G04F 10/00* | (2006.01) |

(52) U.S. Cl.
CPC .............. *A63B 69/12* (2013.01); *A45C 11/00* (2013.01); *A45C 11/22* (2013.01); *A63B 24/00* (2013.01); *A63B 71/0686* (2013.01); *G07C 1/24* (2013.01); *H04M 1/0262* (2013.01); *A45C 2011/002* (2013.01); *A63B 71/0622* (2013.01); *A63B 2071/063* (2013.01); *A63B 2071/0655* (2013.01); *A63B 2071/0661* (2013.01); *A63B 2208/03* (2013.01); *A63B 2220/17* (2013.01); *A63B 2220/803* (2013.01); *A63B 2220/836* (2013.01); *A63B 2225/50* (2013.01); *G04F 10/00* (2013.01); *H01M 50/209* (2021.01); *H01M 50/24* (2021.01)

(58) Field of Classification Search
CPC ..... A63B 69/12; A63B 24/00; A63B 71/0686; A45C 11/00; A45C 11/22; G07C 1/24; H04M 1/0262
USPC .......................................................... 700/91
See application file for complete search history.

(56) References Cited

U.S. PATENT DOCUMENTS

| | | | | |
|---|---|---|---|---|
| 8,920,963 B2* | 12/2014 | Hirano | ................ | H01H 9/0235 |
| | | | | 429/96 |
| 2005/0030707 A1* | 2/2005 | Richardson | .......... | G06F 1/1626 |
| | | | | 361/679.56 |

(Continued)

*Primary Examiner* — Allen Chan
(74) *Attorney, Agent, or Firm* — David E. Novak; Brannon Sowers & Cracraft PC (57) ABSTRACT

A variety of improvements to portable electronic devices are disclosed, particularly electronic devices designed for use in and around water. The improvements include a more secure interface jack, improved waterproofing techniques, improved battery stability, and improved device functionality. One or more of the disclosed improvements may be incorporated into a variety of portable electronic devices.

5 Claims, 10 Drawing Sheets

(56) References Cited

U.S. PATENT DOCUMENTS

| | | | |
|---|---|---|---|
| 2005/0123161 A1* | 6/2005 | Polany | H04R 1/44 |
| | | | 381/334 |
| 2009/0233655 A1 | 9/2009 | Shi et al. | |
| 2010/0304934 A1 | 12/2010 | Woodson | |
| 2011/0279947 A1 | 11/2011 | Peng | |
| 2011/0292201 A1* | 12/2011 | Westphal | H04N 7/183 |
| | | | 348/81 |
| 2012/0262618 A1* | 10/2012 | Weakly | A45C 11/00 |
| | | | 348/333.01 |
| 2013/0027849 A1* | 1/2013 | Berumen | A45C 11/00 |
| | | | 361/679.01 |
| 2013/0265715 A1 | 10/2013 | Bae et al. | |
| 2014/0278229 A1 | 9/2014 | Hong et al. | |

* cited by examiner

PORTABLE ELECTRONIC DEVICES

CROSS-REFERENCE TO RELATED APPLICATIONS

The present application claims priority to U.S. Provisional Patent Application No. 62/456,181 filed on Feb. 8, 2017, the disclosure of which is incorporated herein by reference.

BACKGROUND

Portable electronic devices such as music players, mobile phones, and the like are commonly used or carried by people performing physical activities such as exercise. Such devices are typically not very rugged and do not often react well to the physical shocks associated with such activities. If the activity involves exposure to water such as with swimming, the hazards to the electronic device are multiplied as few devices are water resistant let alone waterproof to any degree. What is needed are design and functionality improvements to portable electronic devices which increase their durability and utility when used in conjunction with physical activities such as running, swimming, and the like.

DESCRIPTION

For the purposes of promoting an understanding of the principles of the claimed technology and presenting its currently understood best mode of operation, reference will now be made to the embodiments illustrated in the drawings and specific language will be used to describe the same. It will nevertheless be understood that no limitation of the scope of the claimed technology is thereby intended, with such alterations and further modifications in the illustrated device and such further applications of the principles of the claimed technology as illustrated therein being contemplated as would normally occur to one skilled in the art to which the claimed technology relates.

A variety of improvements to portable electronic devices are disclosed, particularly electronic devices designed for use in and around water. The improvements will be described in the following examples using media players for illustrative purposes only. One of ordinary skill in the art will understand that the disclosed improvements may be incorporated into a variety of electronic devices including media players, phones, tablets, tracking devices, smartwatches, fitness trackers, and the like. One of ordinary skill in the art will also understand that one may adapt and incorporate more than one of the following improvements into a single device, as desired.

Figure 1:
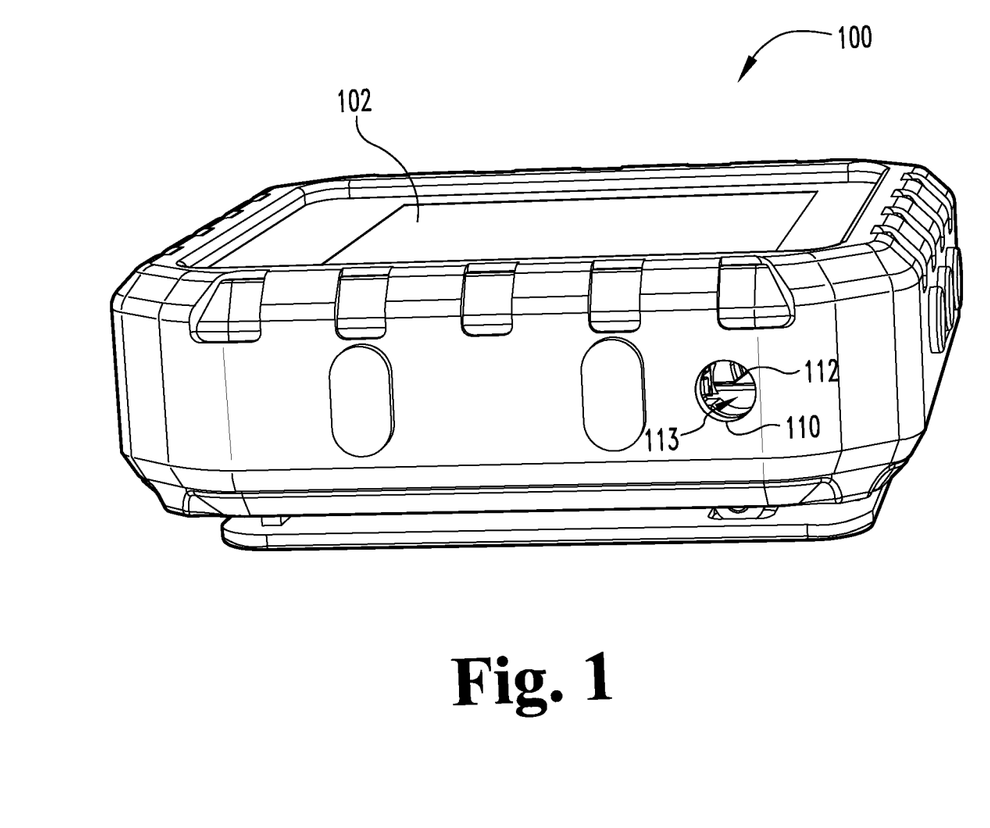
FIG. 1 is a perspective view of a portable electronic device.
Figure 2:
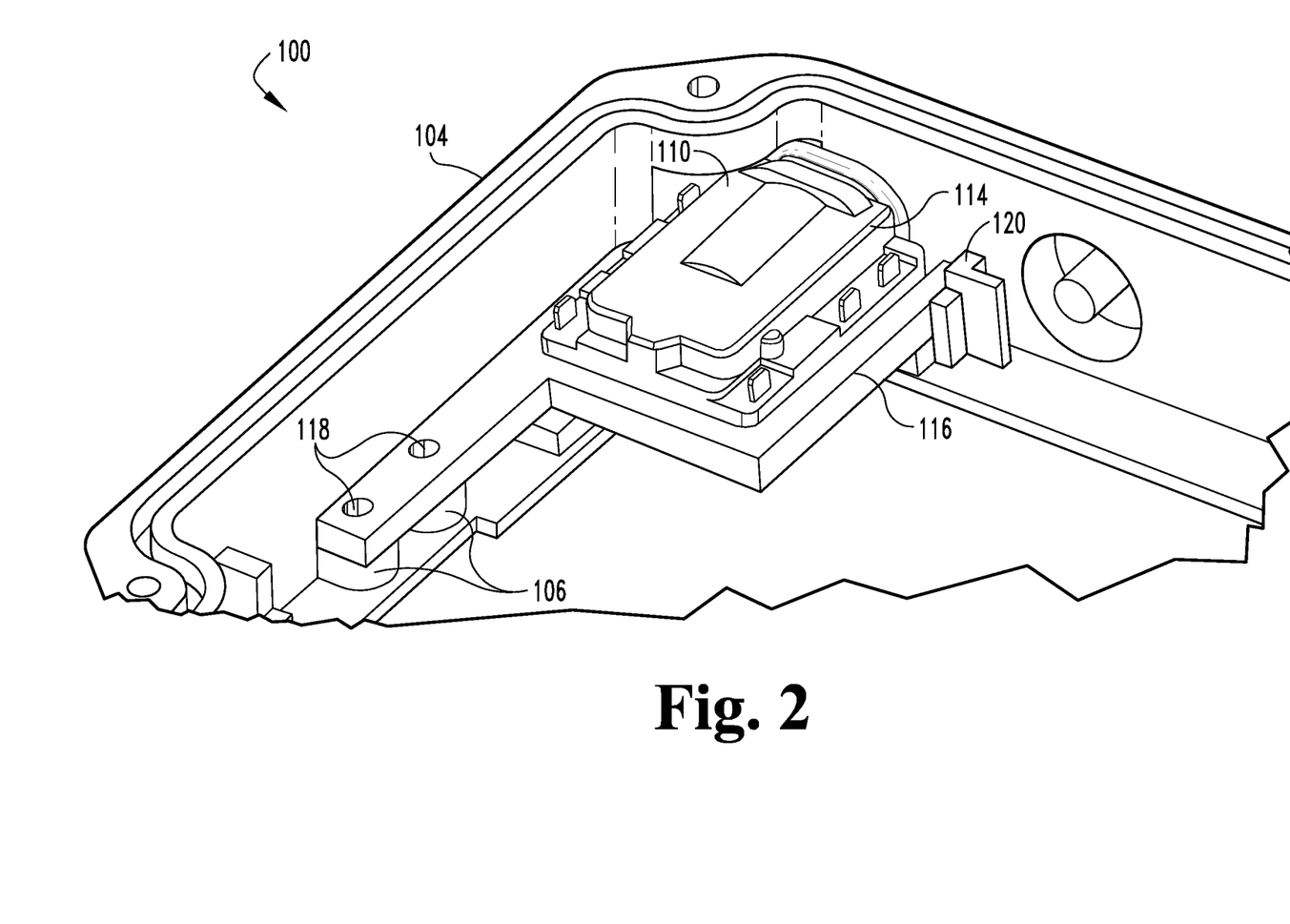
FIG. 2 is a perspective view of the interior of a portable electronic device.

FIG. 1 shows a perspective view of a portable electronic device 100. In this particular example, the device is a music player 100 having a touch screen 102 and including an opening 112 sized and configured for a single connection jack 110 having a socket 113 sized for a headphone plug, for example. FIG. 2 shows the interior of the music player of FIG. 1 where the output jack 110 is mounted in a bracket 116. The bracket 116 may be mounted to multiple mounting points disposed inside the player case 104. Optionally, the case 104 may include mounting points 106, 120 molded or otherwise formed directly as part of the case body itself. Such mounting points may include mounting posts 106 corresponding to mounting points 118 on the bracket 116. Optionally, the bracket may be fixed to the case at such points using screws, adhesives, sonic welds, or other suitable means. The jack body 114 may be held in the bracket 116 using a variety of suitable permanent and non-permanent means such as glues, adhesives, sonic welding, friction fit, interference fit, and the like.

Figure 4:
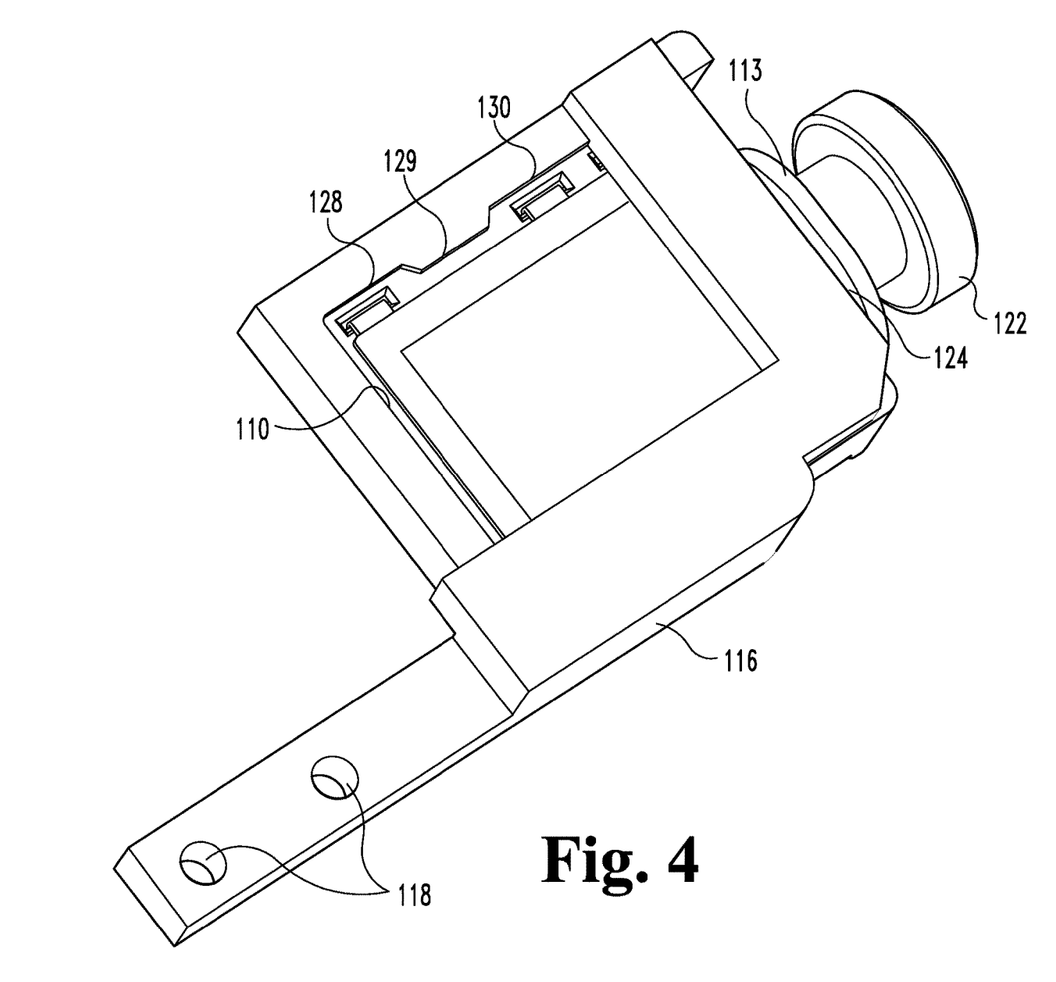
FIG. 4 is a bottom view of the bracket shown in FIG. 3.

In this particular example, the jack body 114 is secured to the bracket 116 using a friction fit. FIG. 4 shows the base of the jack body 114 engaged with the bracket 116. In this example, the jack body 114 includes two protrusions 128, 130 which interact with two corresponding recesses on the bracket as well as a recess 129 on the jack body which interacts with a protrusion on the bracket to create a friction fit which helps hold the jack body in the bracket. Other examples may include more or fewer interacting protrusions and recesses. In other examples, the jack body may be slightly larger than the opening in the bracket so as to create an interference fit when the jack body is pressed into the bracket opening.

Figure 3:
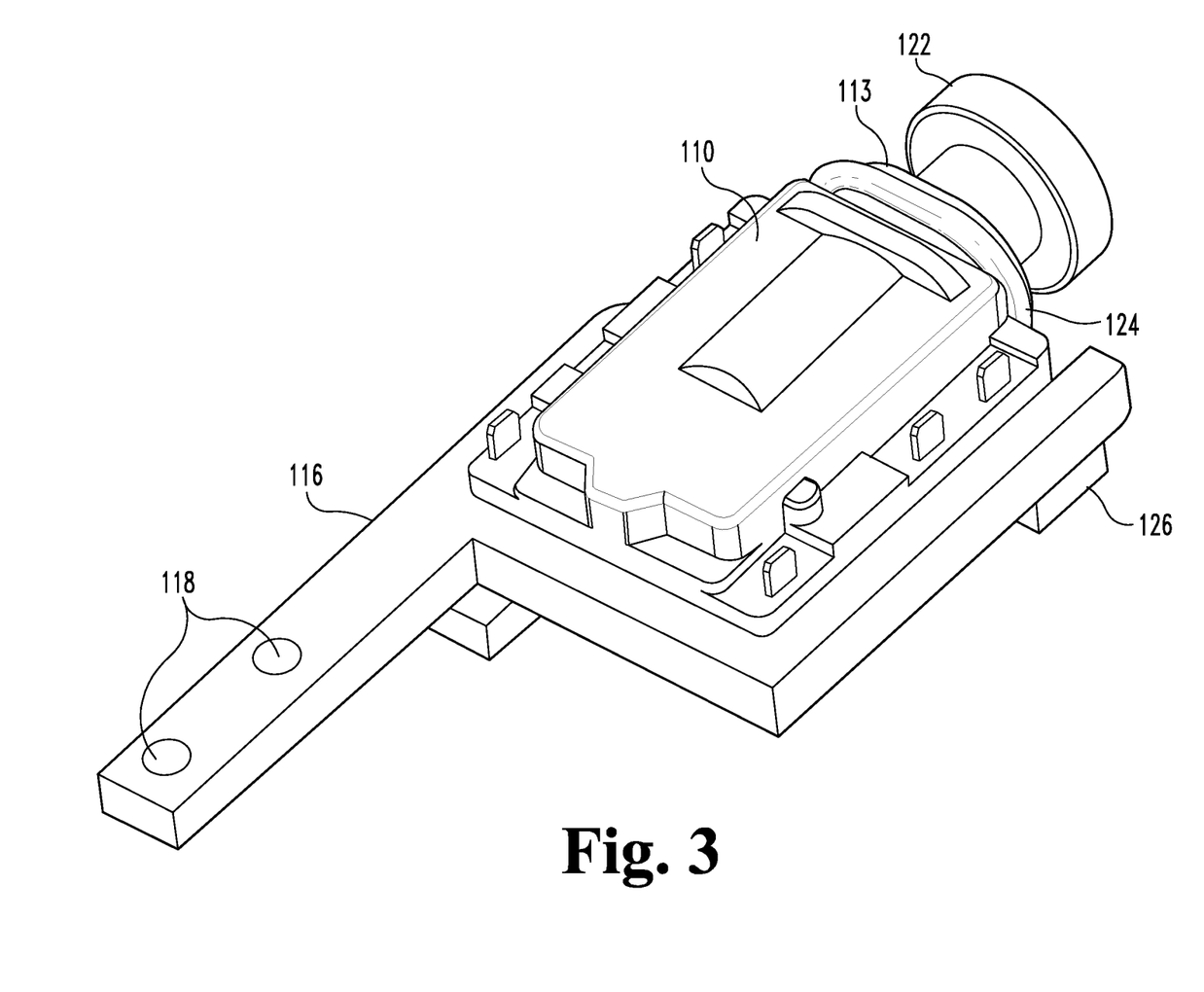
FIG. 3 is a perspective view of a mounting bracket.

As shown in FIG. 3, a device plug 122 can be inserted into the socket 113 of connection jack 110. The output device such as speakers, headphones, and the like as well as any connecting wire has been omitted from this view for the sake of clarity. Optionally, the jack optionally includes a gasket, glue, or adhesive 124 which acts to keep dirt and liquids from entering the device interior through the jack opening in the housing. Optionally, the bracket 116 may include one or more protrusions or feet 126 which act to space the bracket and jack body from any PCB inside the player.

Figure 5:
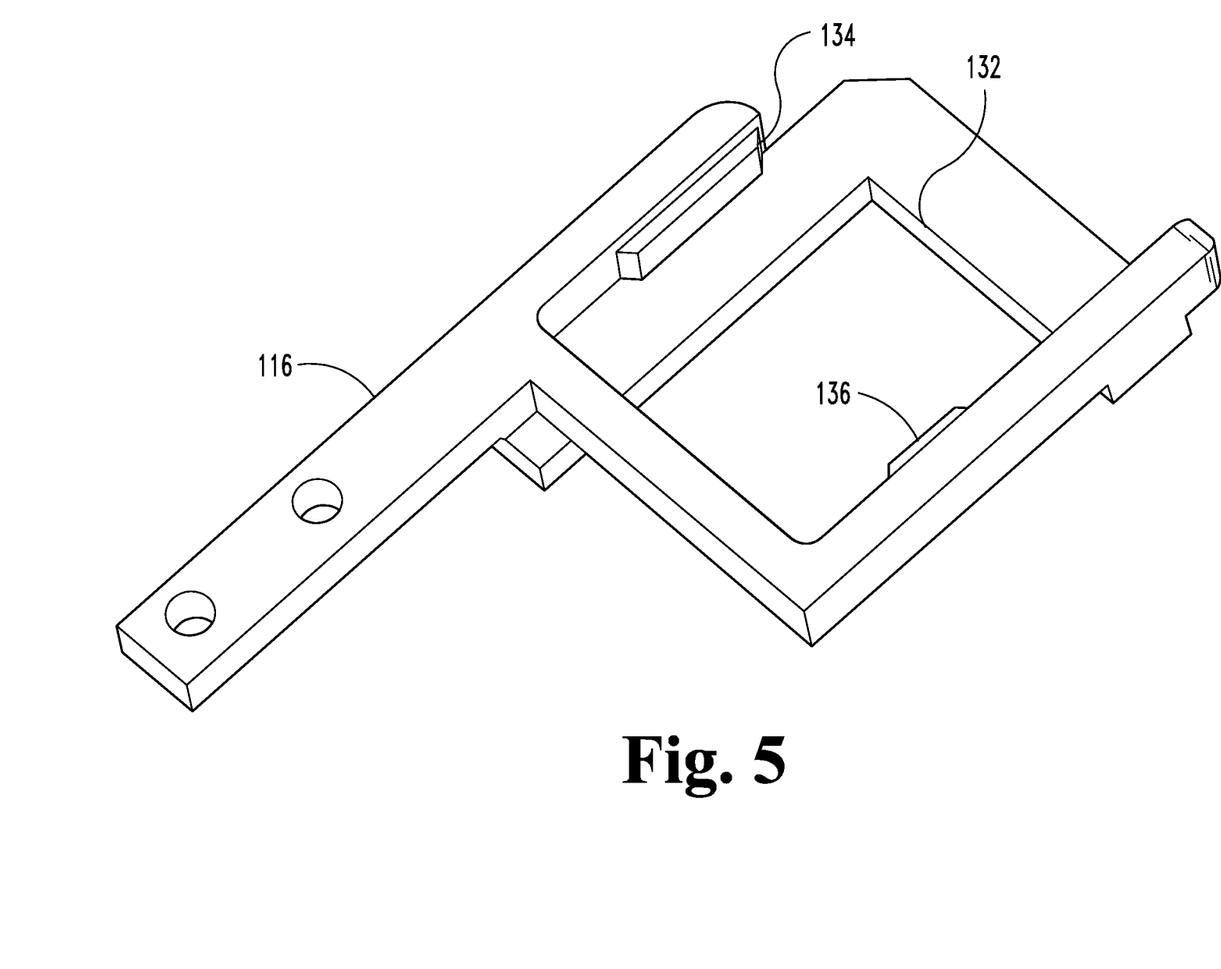
FIG. 5 is a perspective view of a mounting bracket.
Figure 6:
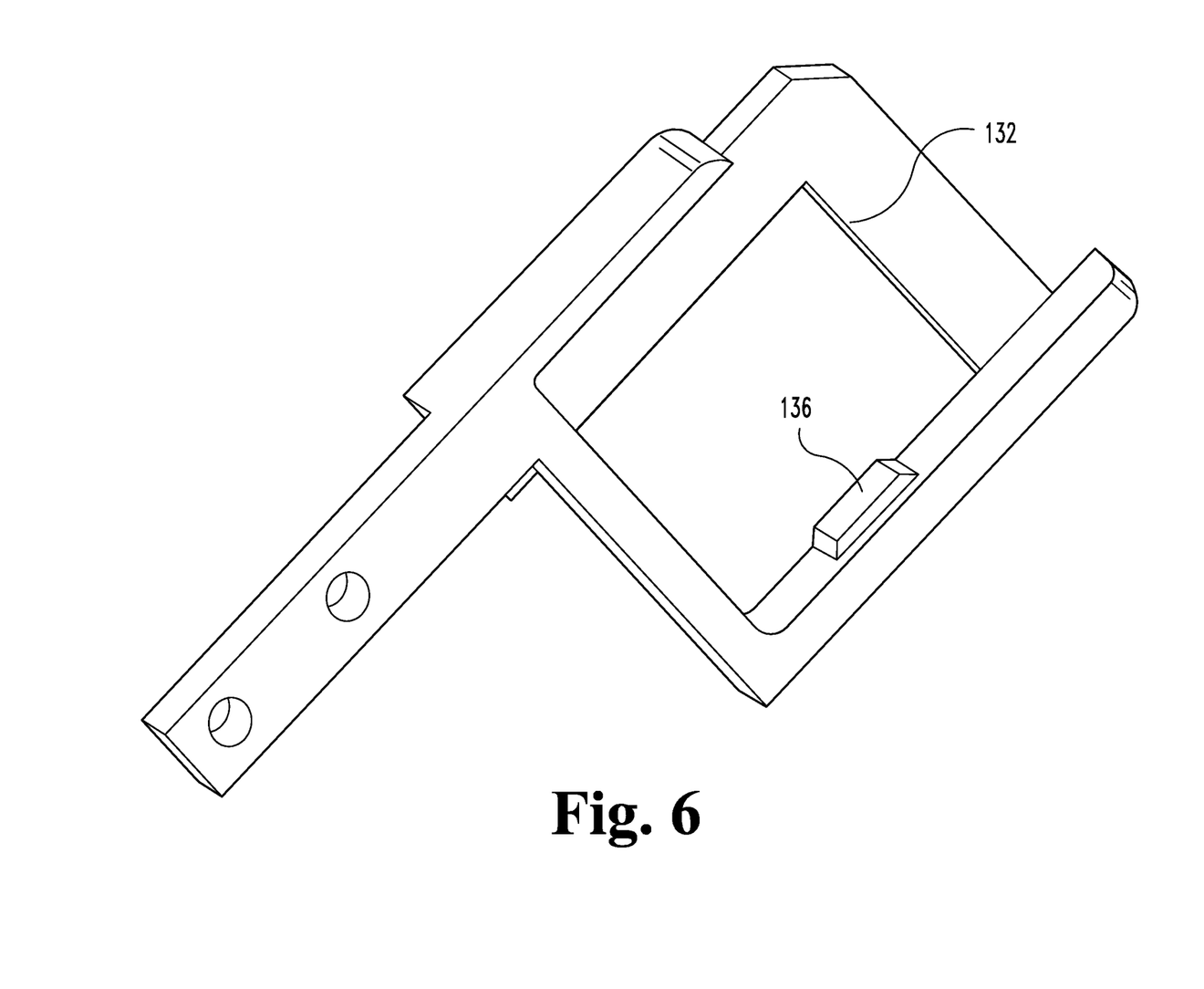
FIG. 6 is bottom view of the bracket shown in FIG. 5.

Optionally, the bracket 116 may further include one or more protrusions 134, 136 as shown in FIGS. 5-6 which correspond to slots or recesses molded into the jack body (not shown). Once pressed into place the protrusions and recesses interact to form an interference fit between the jack body and the bracket. Optionally, two or more such mounting means may be used in a single jack and bracket arrangement to help insure a secure fit.

Physically separating the jack body from the PCB or other electronics of the media player or other portable electronic device allows the jack to be securely mounted (to the bracket which is mounted to the device case) and prevents any movement of the jack body from damaging the device electronics during use. To be useful, however, the jack must still be operationally/electronically connected to the electronics of the device. Such connection can be accomplished using any suitable connection means so long as they are sufficiently flexible to allow the jack body to move and flex relative to the internal electronics without breaking the connection. Suitable connection methods include, but are not limited to wires, flexible printed circuits, conductive polyester films, printed circuits on non-conductive polyester substrates, foil circuits, flexible flat cables, and the like. Any sufficiently flexible conductive material capable of operationally connecting the jack to one or more Printed Circuit Boards (PCB) or other internal electronic components of the device may be used. For example, a wire 210 may operationally connect the jack 110 to a PCB board 200 at a connection point 220 such as shown in FIG. 2. The connection 220 may be accomplished using solder, a mechanical connection, or other suitable means.

This written description provides examples of the improved jack mounting in a portable electronic music device. These examples are for illustrative purposes only and one of ordinary skill in the art would understand that the improved jack of this disclosure could be adapted for use in any number of different portable electronic devices such as phones, computers, tablet devices, watches, and the like. These examples also show the improved jack mounting being used with a jack designed to accept a single mini audio jack of the type typically used with headphones. One of ordinary skill in the art would also understand that the improved jack mounting of this disclosure could be adapted and used with jacks designed to accept other types of inputs and input devices such as single and dual phone or audio jacks, USB, USB mini, USB micro, USB Type-C, RCA connectors, modular connectors (4P4C, RJ11, and the like), DN type connectors, and the like from any desired input source or output device such as headphones, microphones, digital storage devices, power sources, external screens, projectors, docking stations, and the like.

A variety of different types of batteries are used to power portable electronic devices such as alkaline (zinc-manganese), nickel-metal hydride (NiMH), nickel-cadmium (NiCd), lithium-ion (LIB), and the like. Batteries may be installed so as to be easily removable by the user such as by removing a cover, but such arrangements are poorly suited for some applications. Portable electronics designed for rugged use such as during exercise may have their batteries dislodged during use causing poor performance and possible damage to both the battery and the device. In other devices, the batteries may be secured within the device using adhesive, glue, cement, epoxy, or the like. Such arrangements are more secure than simply holding a battery in place with a cover, however they make removal and replacement of the battery difficult. Additionally, batteries may be dislodged from such adhesives if a sufficient shock force is applied such as if the device is dropped from a sufficient height or if the adhesive has degraded over time.

Figure 7:
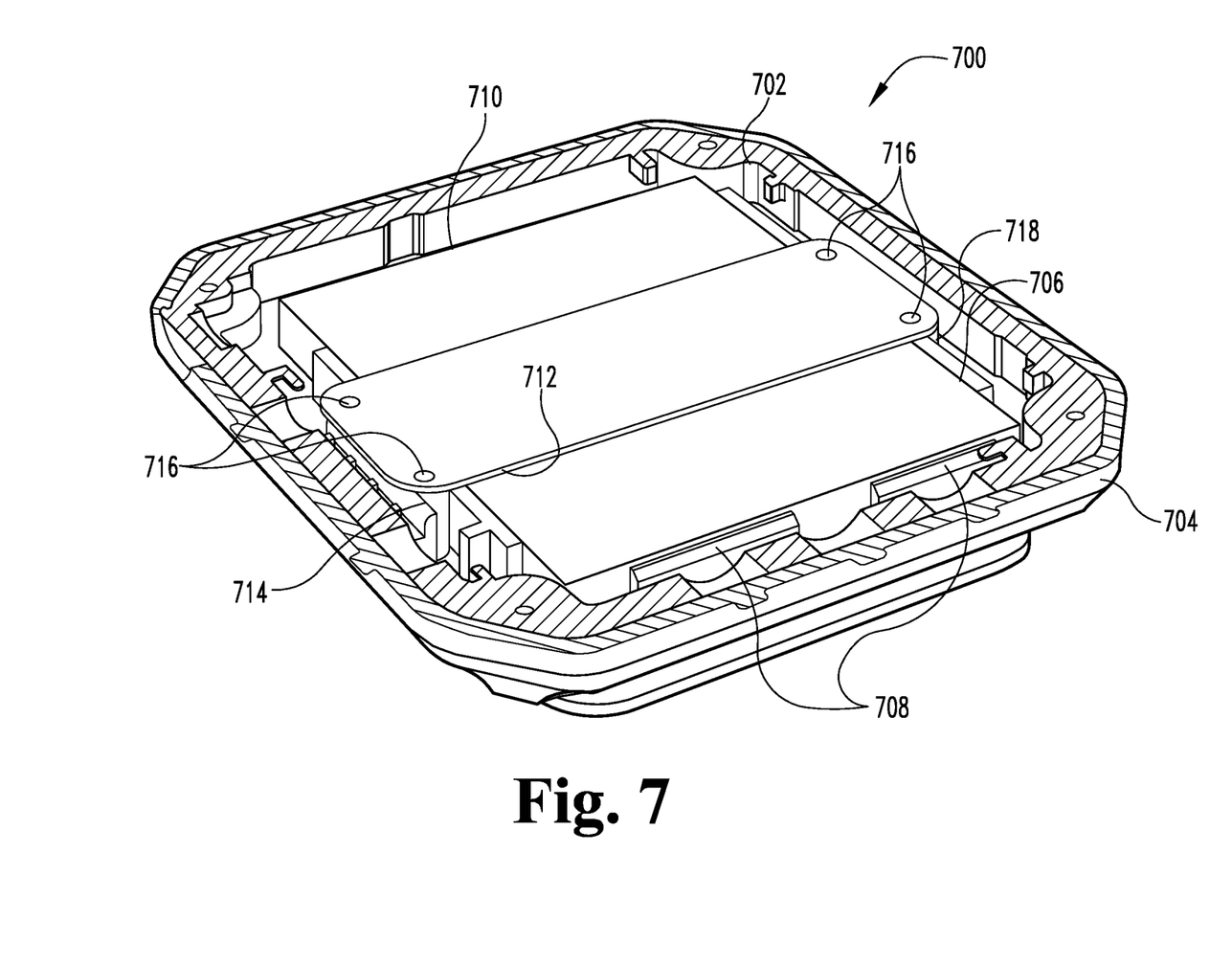
FIG. 7 is perspective view of the interior of another portable electronic device.

FIG. 7 shows a perspective view of a portable electronic device 700. In this particular example, the top portion of the electronic device 700 has been removed to show the battery chamber 702 in the lower portion 704 of the device 700. The battery 710 is disposed within the chamber 702 and prevented from moving laterally by one or more retaining members or structures 708. The exact number and configuration of such retaining structures will vary from device to device. In other examples, the battery chamber is sized and configured to hold the battery without any such structures. The structures may be molded into the case and/or the battery chamber, or may be separate structures which are then secured using glue, adhesive, sonic welding, epoxy, or other suitable means.

The battery 710 is secured in the battery chamber 702 using a strap member 712. The strap member 712 in this particular example is sized and configured to be disposed across the battery 710 so as to hold the battery 710 against the base of the battery chamber 702. The strap member 712 is secured such as to two securing or mounting structures 714, 718 disposed on opposite sides of the battery 710 at a plurality of securing points 716. In this particular example there are four securing points, although greater or fewer may be used in other examples. The strap member 712 may be secured to the securing structures 714, 718 using pins, screws, rivets, posts, tabs, snaps, or other fasteners or suitable securing means. In some examples, the securing means are removable without damaging the securing structures so that the strap member may be removed and the battery replaced. In other examples, the strap member is more permanently mounted to the securing structures such as by sonic welding, epoxy, cement, or the like. The securing structures 714, 718 may be molded into and part of the case and/or battery chamber, or may be separate structures which are then secured using glue, adhesive, sonic welding, epoxy, or other suitable means. In other examples, the securing structures may be modified retaining structures. In still other examples, the strap member is secured to a securing structure at one end and secured to the case, the battery chamber, and/or a securing structure using a latch, hinge, ledge, lip, friction fit, interference fit, or the like.

The exact size, shape, and configuration of strap member as shown in FIG. 7 is for illustrative purposes only. In other examples of the disclosed invention, a retaining strap may be larger or smaller relative to the battery being secured, may have a different shape, or configuration. Optionally, more than one retaining strap may be used to secure a battery and/or more than one battery may be secured using a single strap. The retaining strap may be made from metal, plastic, carbon fiber, composite material, or other suitable material. In other examples, the strap may comprise more than one layer so that one material contacts the surface of the battery being secured and other material(s) comprise the other surfaces of the strap. In still other examples different portions of the strap may be made from different materials such that one material contacts the battery surface and another contacts the one or more securing structures.

Figure 8:
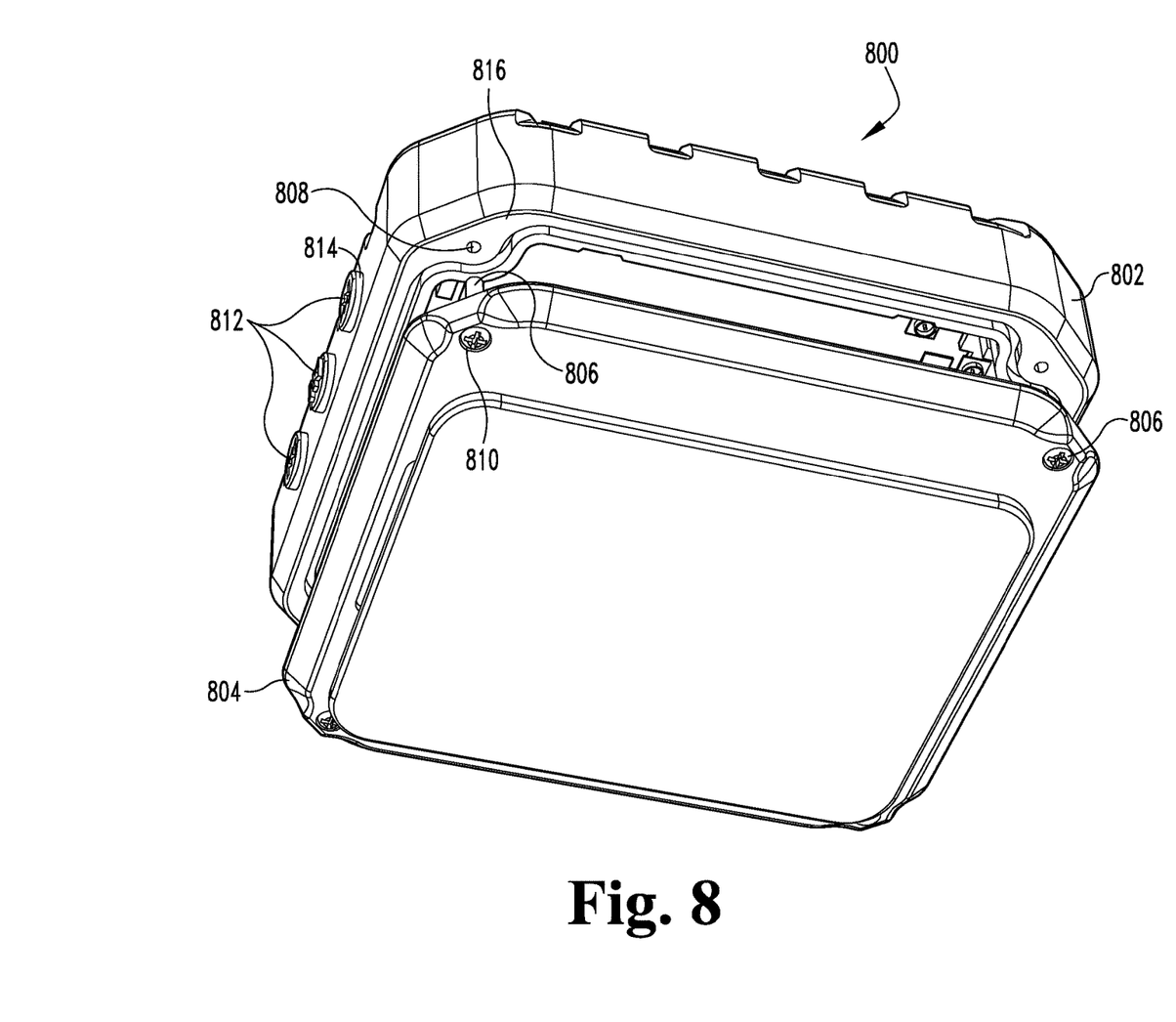
FIG. 8 is an exploded view of the bottom of a portable electronic device.
Figure 9:
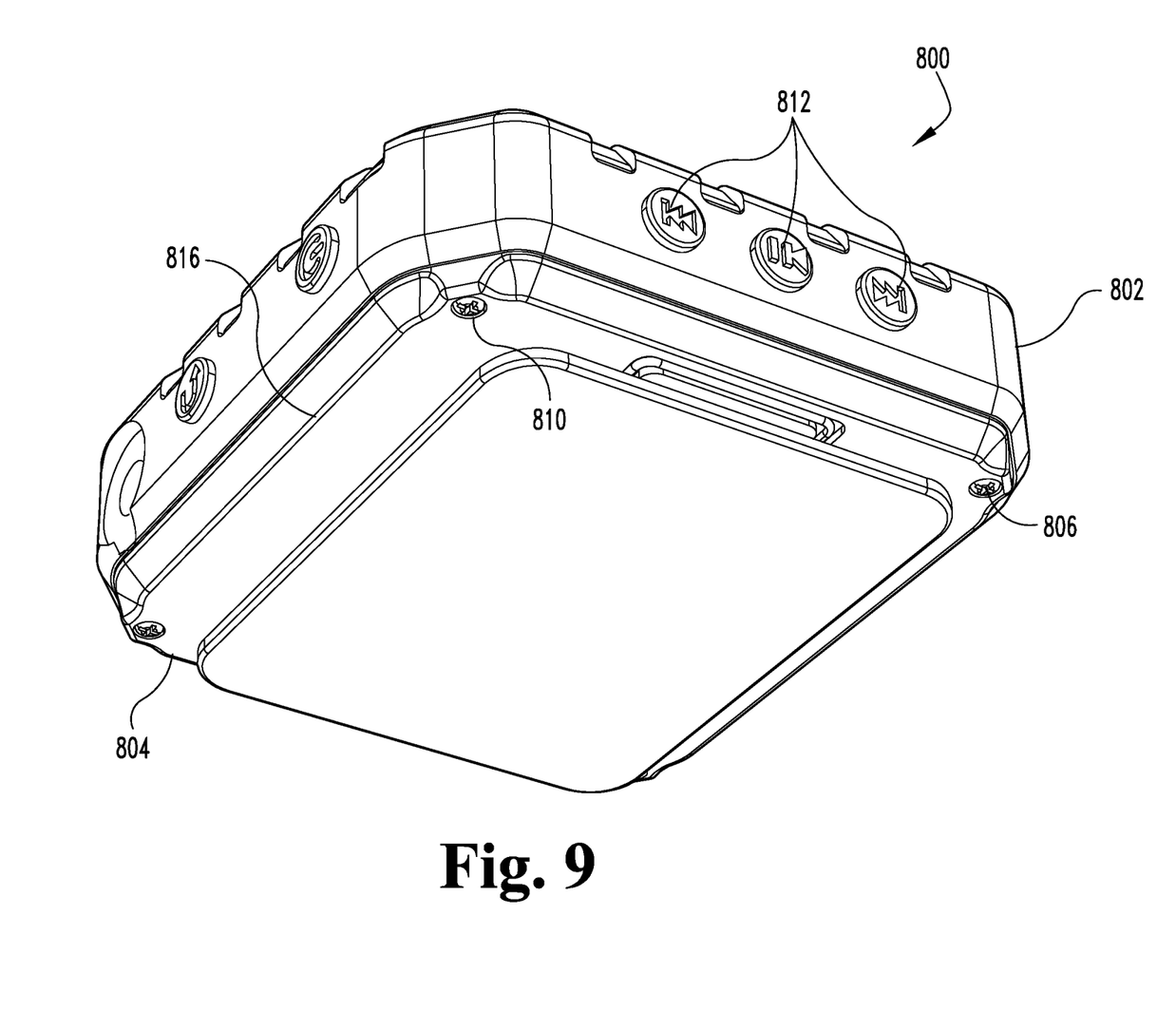
FIG. 9 is a perspective view of the device shown in FIG. 8.

FIGS. 8-9 show a perspective view of a portable electronic device 800 having improved waterproofing for use in and around water. The device 800 has an upper case portion 802 and a low case portion 804 which enclose internal components (not shown) and protect them from moisture. The type, number, and nature of the electronic components will vary from device to device, but one or more of the following techniques may be used as desired. The lower case portion 804 is joined to the upper case portion 802 using a plurality of fasteners 806. In this particular example four screws are shown, but a different number, type, and/or distribution of fasteners may be used as desired. Each fastener 806 passes through an opening 810 in the lower case portion 804 and is secured in a corresponding mounting point 808 in the upper case portion 802. A channel 818 formed in the upper case portion 802 is disposed between the mounting points 808 in the upper case 802 and the interior wall 820 of the upper case 802. Waterproofing material disposed in channel 818 then prevents the ingress of water to the case via the fastener openings 810. In another example, a similar arrangement of placing a channel containing waterproofing material or sealant between the fastener openings 810 in the lower case portion and the case interior may be used. In still another example, one of the upper or lower case portion includes a channel and the other of the upper or lower case portion includes a corresponding ridge which fits within the channel. Waterproofing, sealant, or glue may be used to help secure the ridge within the channel.

To prevent ingress of water to the case via the fastener openings 810, waterproofing material is applied inbound of the fasteners 806, either at the openings 810, inside the mounting points 808, or both. The waterproofing material may include glue, adhesives, grease, polyurethanes, and the like. Optionally, a mechanical barrier may also be used such as gaskets made of thermoplastic elastomers, rubber, and the like. In still other examples, the upper and lower case portion may be joined together such as with a cement or sonic welding. Optionally, other joints 720 such as that between the lower portion 704 and the battery chamber 702 as shown in FIG. 7 may be waterproofed using similar techniques.

The device 800 shown in FIGS. 8-9 may also include an overmold portion 816. In this particular example, a portion of the upper case 802 is overmolded with a waterproof material. In other examples, other parts of the device may include more or less overmolded portions which also may be added to improve impact resistance of the device. The overmolding material may include thermoplastic elastomers, thermoplastic rubbers, polyurethanes, and the like. One or more control buttons 812 are overmolded in this example to prevent water from ingress through the housing. In such applications, the overmolded material should be sufficiently flexible to allow a user to actuate the buttons and durable enough to resist cracking through repeated flexure from use.

Figure 10:
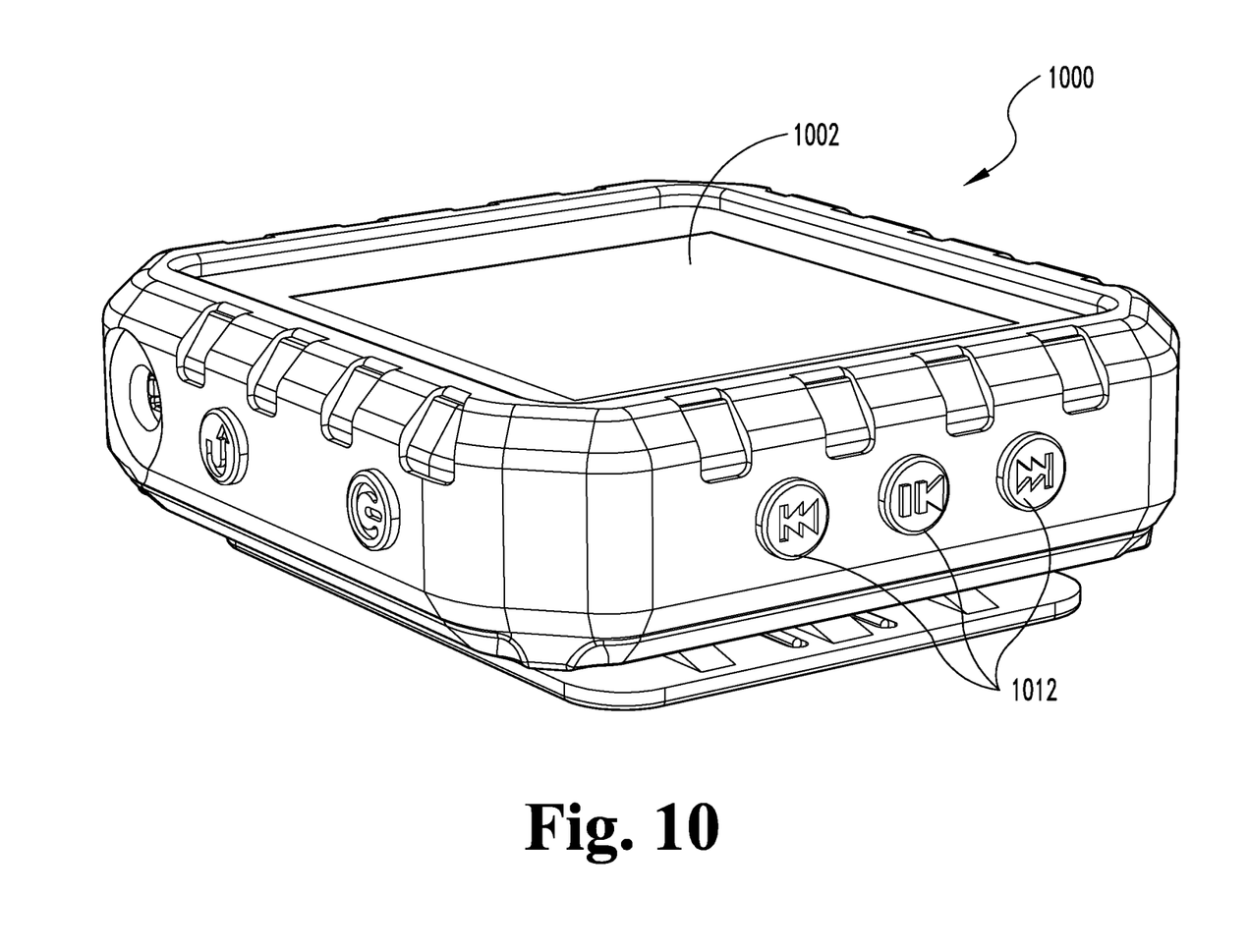
FIG. 10 is a perspective view of an electronic device having a touch screen.

Many portable electronic devices such as the media player 1000 shown in FIG. 10 include a touch screen 1002 as an interface. Such interfaces are common on many electronic devices such as tablets, phones, computers, and the like. While such interfaces are convenient for users, they typically do not function well when the screen is wet. This makes the use of touch screens on devices designed for use in wet environments such as showers, swimming pools, and the like problematic. One way to deal with the shortcomings of touch screen interfaces in wet environments is by using one or more buttons 1012 to supplement the touch screen controls. Such buttons may be protected against water intrusion using such methods as previously described. Each button may be assigned a single function (e.g., play, stop, fast forward, etc.), may be assigned more than one complementary function (e.g., play and stop), or may be assigned multiple functions depending on how long they are depressed (e.g., skip track if held for two second, fast forward if held for four seconds). The exact number, arrangement, and functionality of such control buttons may vary from device to device.

In another example the device includes one or more motion sensors which can be used to determine when the device is being used and/or in motion. Such arrangements are particularly useful in devices designed for use by users engaging in physical activity (media/audio players, fitness trackers, lap counters, timers, etc.). The device may determine that it is presently being used when the motion sensor(s) detect at or above a threshold level of motion. When the level of motion drops below a certain threshold for a predetermined period of time indicating it is no longer being used the device may automatically turn off. Optionally, the device may have different stages or priorities of powering down depending on the level or duration of inactivity. For example, powering down a touch screen after one period of time, going into a partially powered down (sleep or standby) state after a second period of time, and completely powering off after a third period of time. In other examples, the device may disable certain functions when a predetermined threshold of motion is detected. For example, a user who is a runner may want the power off button disabled if the device is in motion to prevent accidentally shutting the device off when in use. Other combinations of enabling/disabling functionality depending on detected motion are also contemplated.

In other examples the electronic device may include wireless communication hardware or circuitry which uses one or more forms of wireless communication such as WiFi, Bluetooth® (Trademark owned by Bluetooth Special Interest Group, 5209 Lake Washington Boulevard NE Suite 350 Kirkland Wash.) or other method to connect the device to other devices and/or to a remote server or computer. Such connectivity could be used to allow a device to communicate either directly or indirectly through a remote server, with another device being used by another user. Devices designed for use in and around water must overcome reduced connectivity caused by the reduced ability of most wireless signals to penetrate or travel well in water. Another way of increasing the range of communication between devices would be to use a mesh network topology. Instead of one device being the server, and serving the messages to all the other devices, the message could be passed from client to client, allowing clients out of range of the server to still receive the message.

In still other examples, the device may include location-determining hardware such as GPS. Such hardware may be used to compare a desired or predetermined course to an actual course. If deviation which exceeds a predetermined threshold from the desired course is detected feedback may be given to the user in the form of physical stimulation such as vibration, visual, and/or auditory signals. For example, an open water swimmer may set a preplanned course and program the device to signal if a deviation of greater than 0.5 degrees is detected by vibrating once if the deviation is to the left and twice if it is to the right of the desired course.

In one example, devices may be capable of sending and receiving audio and/or text-based messages to one another. Once a message was received, the receiving device could send a confirmation message back to the sending device to acknowledge receipt of the message. The message back to acknowledge receipt may be sent multiple times to insure successful delivery. If the audio message was not received, repeated attempts could be made to send the message until receipt was confirmed. For example, a coach could send a message to a swimmer which would interrupt a currently playing audio track with audio instructions to change or correct some aspect of the swimmer's stroke. Optionally, the device can be configured to automatically play a message originating from a particular source device (e.g., the device used by a coach) so that the user does not have to interrupt any current activity to play the message. In other examples, the device may be capable of selectively sending messages to one or multiple recipients as desired. For example, if a coach wished to communicate to only certain swimmers in a practice pool but not others.

Data other than audio messages could also be sent and conveyed including metrics related to fitness and performance. This information could be displayed in a way that one individual could observe metrics of fitness and performance of many users connected through devices in real time. This information could inform the user in real time so that the user could communicate to device users regarding their performance via audio messages.

Some of the portable electronic devices according to the disclosed invention are capable of detecting, counting, and tracking laps and information related to laps (individual lap time, average lap time, etc.) for swimmers or other athletes. Such devices typically include at least one processor which can process instruction and interact with a memory for storing and operating software. The memory is also capable of receiving and storing data collected from one or more devices. In one example, such devices include at least one gyroscope. In other examples, additional data sources may be used in combination with a gyroscope such as an accelerometer. The user may press a button to begin the lap tracking which activates the tracking routine to collect and process data from one or more components associated with the device (e.g., a gyroscope). A variety of different data analysis methods may be used to determine lap information from the collected data.

One example of lap analysis may be accomplished using data collected from an on-board gyroscope. Optionally, additional data may be collected from an accelerometer to enhance lap analysis. In this example, an algorithm transforms the collected gyroscopic data by summation. The algorithm will also work with other data transformation methods, including but not limited to averaging, differentiation, integration, and logarithmic data analysis methods. The data can be passed into the algorithm as either a data stream, or individual pieces of data (data-points). Each data-point sequentially then enters a data buffer whose size is based off of a given amount of time. When the data buffer is full, the data-point enters at the top and a data point is removed from the bottom, then the top half and the bottom half are summed, and the difference is taken of those sums (it does not matter which order the difference is taken in). The difference is then added to a total sum that is then divided by the count of data-points added to the algorithm creating a rolling average of the differences of the sums of the top and bottom halves of the data buffer. Then, if the algorithm is not in the waiting state, the data buffer is full, and the current time is greater than the start time plus some given value the algorithm checks for a turn. It does this by checking if the current difference of the top and bottom halves of the data buffer is greater than the current rolling average multiplied by a given threshold. For a given amount of time after the start of tracking, the threshold is different than after that amount of time. If this process detects a turn, a counter is incremented, and the algorithm enters the waiting state. If the algorithm is in the waiting state when the data-point has been added, it checks if the algorithm has been in the waiting state for longer than a set amount of time. If the algorithm has surpassed the set amount of time, the algorithm exits the waiting state. If not, the algorithm checks if the peak-correction subroutine has been completed during this wait time. If not, it checks if the current data buffer halves difference is greater than the previous data buffer halves difference. If the difference is greater, the algorithm stores those values. If the difference is not greater, it stores the time between the current time and the last time a turn was counted, generating a time for the last turn. If this turn time is less than some value times the current average lap time, it is summed with the other turn times and divided by the amount of turns summed, giving an average lap time. After a number of turns this average turn time multiplied by a certain value is used as the amount of time to stay in the wait state.

In another example, data from the gyroscope is processed by summing the data points outputted by the gyroscope as they are collected in a rolling sum. Then, the summed data is evaluated in real time to discover moments where the device/user are rotating in a stable direction for a predetermined period of time (this action is considered a turn). Two turns are considered one lap. These moments where the user turns are found by using standard peak detection methods to evaluate the rolling sum of the output from the gyroscope. The sum of the outputs from the gyroscope are also filtered with a few different methods including a low-pass filter. The methods described are just two examples of how to analyze the data. Other ways to analyze the data to determine lap count and other swimming related metrics include but are not limited to, peak detection and filtering, summation and plateau detection, noise detection and exclusion, and the like.

While the claimed technology has been illustrated and described in detail in the drawings and foregoing description, the same is to be considered as illustrative and not restrictive in character. It is understood that the embodiments have been shown and described in the foregoing specification in satisfaction of the best mode and enablement requirements. It is understood that one of ordinary skill in the art could readily make a nigh-infinite number of insubstantial changes and modifications to the above-described embodiments and that it would be impractical to attempt to describe all such embodiment variations in the present specification. Accordingly, it is understood that all changes and modifications that come within the spirit of the claimed technology are desired to be protected.

What is claimed is:

1. A portable electronic device, comprising:
    a case having an upper portion and a lower portion which form an enclosure, the upper portion having a touch screen, and the lower case portion having a battery chamber;
    a strap secured to the battery chamber and disposed to hold the battery within the battery chamber when the upper case portion is removed from the lower case portion;
    at least one circuit board disposed within the enclosure having a processor and a memory, the at least one circuit board operationally connected to the touch screen;
    at least one channel disposed in the lower case portion where the lower case portion joins the upper case portion;
    at least one fastener securing the upper case portion to the lower case portion;
    wherein the at least one channel is disposed between the at least one fastener and the enclosure;
    wherein a waterproofing material is disposed within the at least one channel.

2. The portable electronic device of claim 1, further comprising at least one gyroscope disposed in the case.

3. The portable electronic device of claim 1, further comprising an overmolding and at least one control button covered by said overmolding.

4. The portable electronic device of claim 1, further comprising circuitry for wireless communication.

5. The portable electronic device of claim 1, further comprising:
    at least one connection jack; and
    at least one mounting bracket;
    wherein the at least one mounting bracket it secured to one of the upper case portion and the lower case portion;
    wherein the at least one connection jack is secured to the at least one mounting bracket and operationally connected to the at least one circuit board.

* * * * *